US007859294B1

(12) United States Patent
Jenkins, IV (10) Patent No.: US 7,859,294 B1
(45) Date of Patent: Dec. 28, 2010

(54) METHOD AND ARRANGEMENT FOR REDUCING POWER IN BIDIRECTIONAL INPUT/OUTPUT PORTS

(75) Inventor: Jesse H. Jenkins, IV, Danville, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 12/358,121

(22) Filed: Jan. 22, 2009

(51) Int. Cl.
 *H03K 17/16* (2006.01)
(52) U.S. Cl. .............................. 326/21; 326/38; 326/56; 326/82
(58) Field of Classification Search .............. 326/37–41, 326/56–58, 83–87
 See application file for complete search history.

(56) References Cited

U.S. PATENT DOCUMENTS

| | | | | |
|---|---|---|---|---|
| 4,987,319 | A | * | 1/1991 | Kawana ........................ 326/37 |
| 5,944,813 | A | * | 8/1999 | Trimberger .................. 712/36 |
| 6,172,518 | B1 | | 1/2001 | Jenkins, IV et al. |
| 6,218,856 | B1 | * | 4/2001 | Sasaki .......................... 326/39 |
| 6,388,467 | B1 | * | 5/2002 | Ward et al. .................... 326/56 |

OTHER PUBLICATIONS

Advanced Micro Devices, Inc., *Programmable Array Logic*, copyright 1984, p. 1-20 (3 pages total), available from Advanced Micro Devices, Inc., Sunnyvale, California, USA.
Xilinx, Inc., *The Programmable Gate Array Design Handbook*, copyright 1986, pp. 2-23 (3 pages total), available from Xilinx, Inc., San Jose, California, USA.

* cited by examiner

*Primary Examiner*—Don P Le
(74) *Attorney, Agent, or Firm*—Pablo Meles; John J. King (57) ABSTRACT

An arrangement and method of reducing power in bidirectional I/O ports includes driving an input signal from an I/O port by asserting a high impedance (Hi-Z) signal to an output drive, driving an output signal from the I/O port by refraining from asserting a Hi-Z signal to an output driver, and feeding back the output signal to an input driver when driving the output signal. The method can float the I/O port when the Hi-Z signal is asserted on the output driver or drive the I/O port as an input when the Hi-Z signal is asserted on the output driver. The method can refrain from floating a signal back into the I/O port when driving a signal out by driving a constant logical zero back into the I/O port or driving a constant logical one back or by maintaining a last value driven.

20 Claims, 6 Drawing Sheets

METHOD AND ARRANGEMENT FOR REDUCING POWER IN BIDIRECTIONAL INPUT/OUTPUT PORTS

FIELD OF THE INVENTION

The invention relates to programmable logic device devices and more particularly to power control or power reduction within programmable logic device designs.

BACKGROUND OF THE INVENTION

Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth. As used herein, note that the terms "include" and "including" mean including without limitation.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices (PLDs), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

Programmable logic devices such as FPGAs frequently use bidirectional I/O connections or pins that are known to be wasteful in terms of energy usage well beyond the energy expended as simple inputs or simple outputs. Exemplary embodiments herein offer various techniques in reducing such wasteful energy usage.

SUMMARY OF THE INVENTION

One or more aspects of the invention generally relate to a method of reducing power in digital bidirectional Input/Output (I/O) ports that can include driving an output signal from the I/O port by refraining from asserting a high impedance (Hi-Z) signal to an output driver and driving an input signal from the I/O port by asserting the Hi-Z signal to the output driver.

In accordance with a second embodiment of the invention, a low power bi-directional Input/Output (I/O) arrangement can be part of a CMOS device and can include a bi-directional I/O port, an output driver coupled to the I/O port, and an input driver coupled to the I/O port and coupled to the output of the output driver. An input signal can be driven from the I/O port by asserting a high impedance (Hi-Z) signal on the output driver and an output signal is driven from the I/O port by refraining from asserting the Hi-Z signal to the output driver. The output driver can have a current blocking pair in the form of a series of P and N channel transistors. The output signal can be fed back to the input driver when driving the output signal. The I/O port floats or the I/O port is driven as an input when the Hi-Z signal is asserted on the output driver. The I/O arrangement refrains from floating a signal back into the I/O port when driving a signal out of the I/O port by driving a constant logical zero back into the I/O port or by driving a constant logical one back into the I/O port or by maintaining a last value driven. The I/O arrangement can alternatively include logic circuitry for selecting one among the functions of driving a constant logical zero back into the I/O port, driving a constant logical one back into the I/O port, or maintaining a last value driven. The term "float" or "floating" in the context of an I/O port or I/O arrangement can mean a port that is in an undefined logical state

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Figure 1:
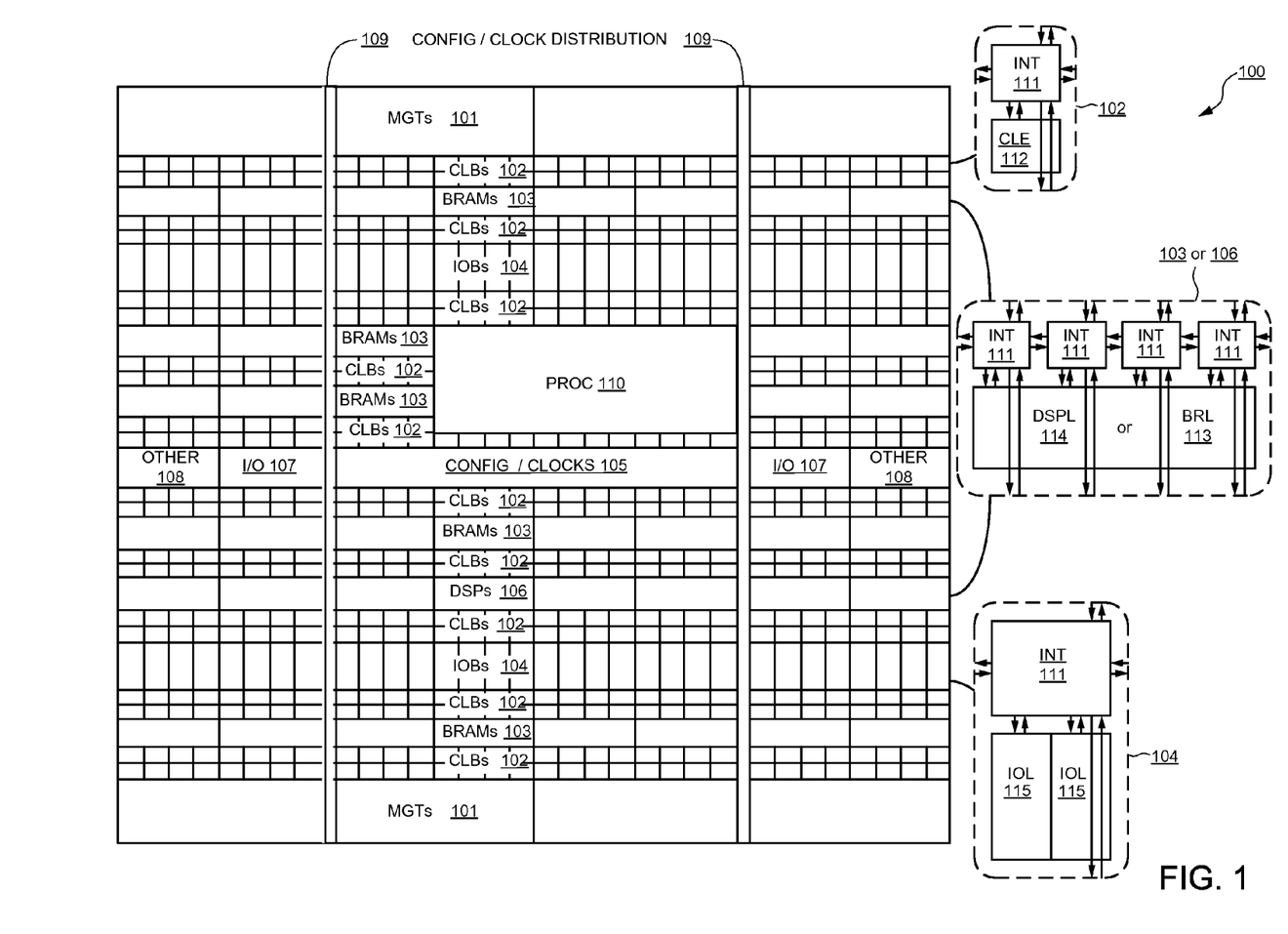
FIG. 1 is a simplified block diagram depicting an exemplary embodiment of a columnar Field Programmable Gate Array ("FPGA") architecture in which one or more aspects of the invention may be implemented.

As noted above, advanced FPGAs can include several types of programmable logic blocks in the array. For example, FIG. 1 illustrates an FPGA architecture 100 that includes a large number of different programmable tiles including multi-gigabit transceivers (MGTs) 101, configurable logic blocks (CLBs) 102, random access memory blocks (BRAMs) 103, input/output blocks (IOBs) 104, configuration and clocking logic (CONFIG/CLOCKS) 105, digital signal processing blocks (DSPs) 106, specialized input/output ports (I/O) 107 (e.g., configuration ports and clock ports), and other programmable logic 108 such as digital clock managers, analog-to-digital converters, system monitoring logic, and so forth. Some FPGAs also include dedicated processor blocks (PROC) 110. Although embodiments herein are more relevant to IOBs and I/O, other portions of the FPGA will be further described below to provide greater context.

In some FPGAs, each programmable tile includes a programmable interconnect element (INT) 111 having standardized connections to and from a corresponding interconnect element 111 in each adjacent tile. Therefore, the programmable interconnect elements 111 taken together implement the programmable interconnect structure for the illustrated FPGA. Each programmable interconnect element 111 also includes the connections to and from any other programmable logic element(s) within the same tile, as shown by the examples included at the right side of FIG. 1.

For example, a CLB 102 can include a configurable logic element (CLE) 112 that can be programmed to implement user logic plus a single programmable interconnect element 111. A BRAM 103 can include a BRAM logic element (BRL 113) in addition to one or more programmable interconnect elements 111. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element (DSPL 114) in addition to an appropriate number of programmable interconnect elements. An IOB 104 can include, for example, two instances of an input/output logic element (IOL 115) in addition to one instance of the programmable interconnect element 111. As will be clear to those of skill in the art, the actual I/O pads connected, for example, to the I/O logic element 115 are manufactured using metal layered above the various illustrated logic blocks, and typically are not confined to the area of the I/O logic element 115.

In the pictured embodiment, a columnar area near the center of the die (shown shaded in FIG. 1) is used for configuration, I/O, clock, and other control logic. Vertical areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block 110 shown in FIG. 1 spans several columns of CLBs and BRAMs.

Note that FIG. 1 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the right of FIG. 1 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA. FPGA 100 illustratively represents a columnar architecture, though FPGAs of other architectures, such as ring architectures for example, may be used. FPGA 100 may be a Virtex-4™ FPGA from Xilinx of San Jose, Calif.

Although the methods and arrangements described herein are provided within the context of PLDs and more particularly FPGAs, please note that the scope of the claims are not necessarily limited to such devices. Power consumption is a growing factor in CMOS logic design generally as density increases and many products enter the portable realm. This is particularly important with portable consumer products. Decreasing power at every facet of a design is an important goal not necessarily met by existing designs. It has been observed that bidirectional I/O pins are particularly wasteful with regard to power consumption and yet existing solutions fail to adequately curb the waste. To that end, the embodiments herein describe a way to substantially reduce power in digital CMOS bidirectional I/Os.

Figure 2:
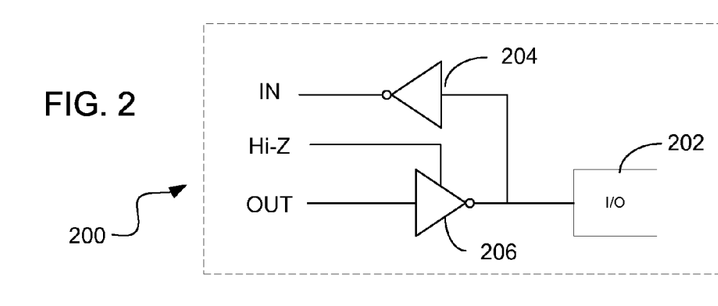
FIG. 2 is a block/schematic diagram depicting an exemplary embodiment of a simplified CMOS Bidirectional circuit in accordance with an embodiment of the present invention.

Referring to FIG. 2, a logic structure of a typical CMOS I/O circuit 200 is illustrated which can form a portion of a larger device such as a PLD or FPGA. The circuit 200 includes an I/O port or pin 20 along with an input driver 204 and an output driver coupled as shown. The circuit 200 is independent of a voltage standard which is largely determined by a VCC level set on the transistors, as well as thresholds dictated by the CMOS process. Operationally and simply stated, when the output is driven, a HI-Z or a high impedance signal is not asserted (at the output driver 206) and the signal hits the I/O pin 202. At the same time, the signal feeds back into the device or chip (such as an FPGA or other PLD) driving the IN signal through the input driver 204. When HI-Z is asserted, the I/O 202 floats or is driven as an input.

Figure 3:
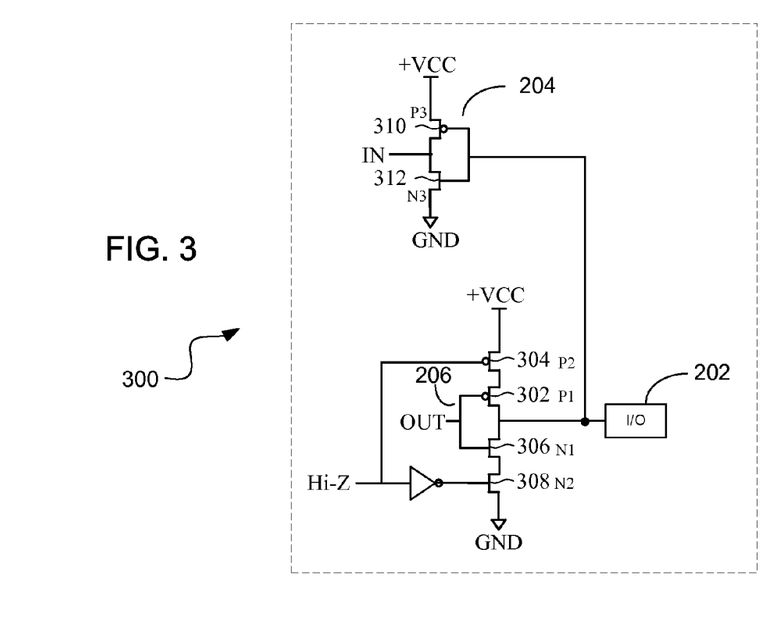
FIG. 3 is a block/schematic diagram depicting transistor detail of the circuit of FIG. 2 in accordance with an embodiment of the present invention.

Referring to a transistor detailed version of the simplified circuit 200 with the circuit 300 of the FIG. 3, the presence of series P and N channel transistors 304 (P2) and 308 (N2) constitute the current blocking pair for the output driver 206, which is comprised of P and channel transistors 302 (P1) and 306 (N1). When HI-Z asserts high, P2 or transistor 304 turns off, as well as transistor 308 or N2 cutting current flow for transistor 302 or P1 and transistor 306 or N1, which floats the I/O pin 202, as well as the input to the input buffer formed by transistor 310 or P3 and transistor 312 or N3. It is recognized that electrostatic discharge (ESD) circuitry, level shifting, and other usual circuitry is specifically not detailed in this diagram in order to focus on the claimed embodiments.

When the I/O pin 202 of FIG. 3 drives out, there is typically no need to drive the input buffer 204, which may be driving a distributed load within the larger device that the circuit 300 is a part of. This arrangement expends energy, which can be suppressed. Furthermore, if the I/O pin 202 floats, this floating forwards into the device also draws additional current.

Figure 4:
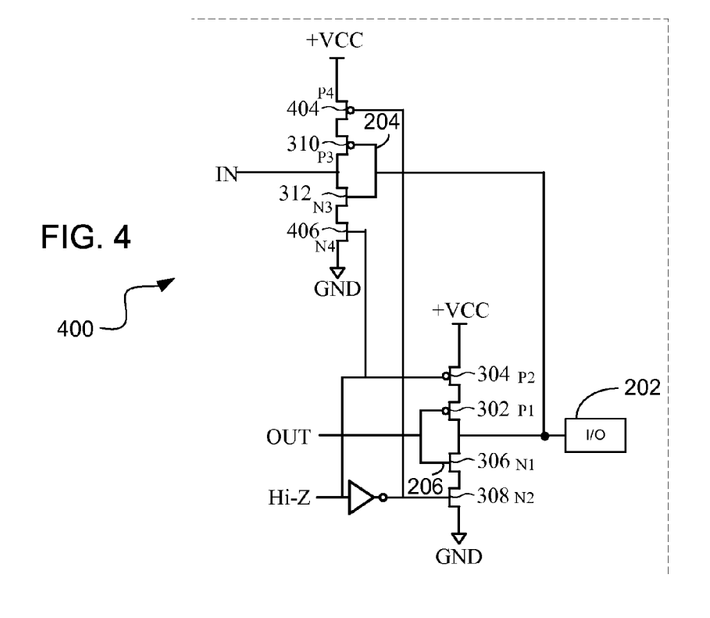
FIG. 4 is a block/schematic diagram depicting transistor detail of an exemplary embodiment of a CMOS bidirectional circuit having additional circuitry for blocking an input driver in accordance with an embodiment of the present invention.
Figure 5:
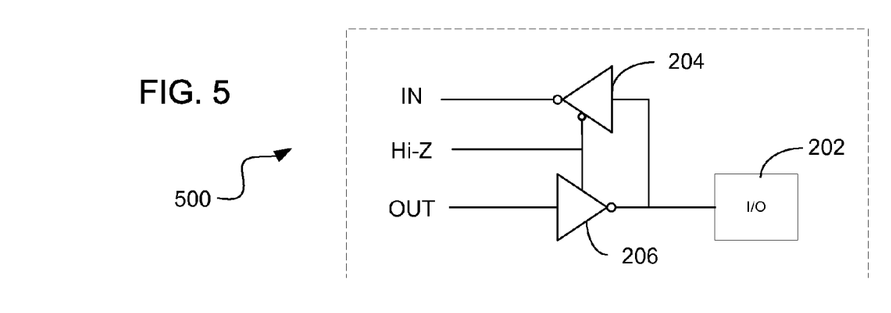
FIG. 5 is a simplified block/schematic diagram of the circuit of FIG. 4 in accordance with an embodiment of the present invention.

Thus, referring to FIG. 4, an incremental improvement over the embodiment of FIG. 3 is shown for blocking current drive back into the device when the output is driving in the circuit 400. By inserting transistors 404 (P4) and 406 (N4) into the input buffer chain, current flow can be successfully blocked from the output driver 206 while the output driver is actively driving the I/O pin 202. The arrangement or circuit 400 reduces switching activity going back into the device, but may not be optimal because it can float it's signal during this time, which may have static power consequences. The circuit 500 of FIG. 5 is merely, a simplified version of the bidirectional I/O circuit of FIG. 4. When driving out, there should be no need to drive a switching signal back into the device, but generally it is undesirable to drive a floating signal back into the device.

Figure 6:
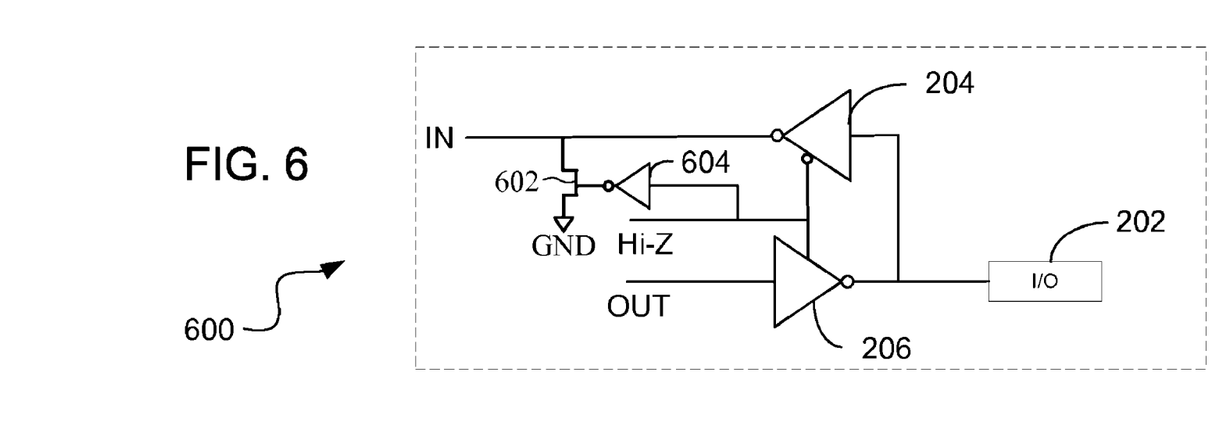
FIG. 6 is a block/schematic diagram depicting a first alternative for an input driver in a CMOS bidirectional circuit in accordance with an embodiment of the present invention.
Figure 7:
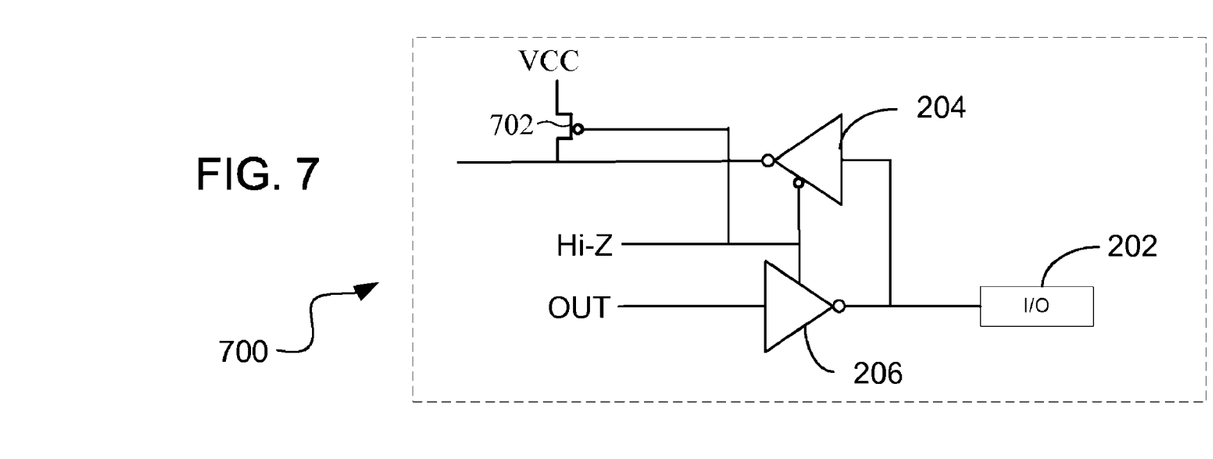
FIG. 7 is a block/schematic diagram depicting a second alternative for an input driver in a CMOS bidirectional circuit in accordance with an embodiment of the present invention.
Figure 8:
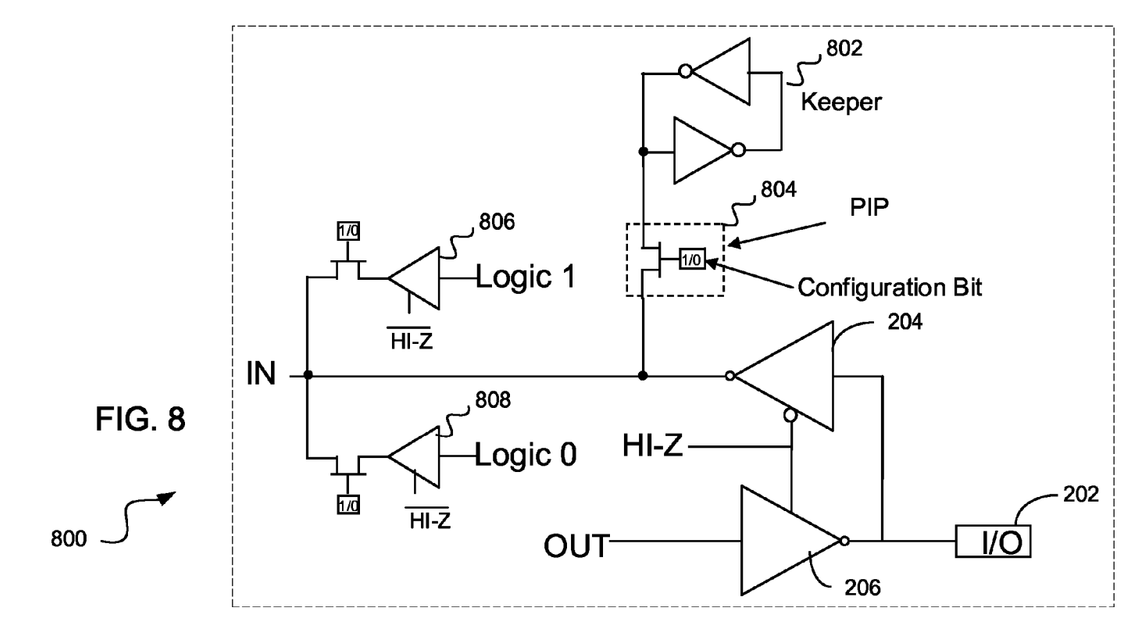
FIG. 8 is a block/schematic diagram depicting a third alternative for an input driver in a CMOS bidirectional circuit in accordance with an embodiment of the present invention.

There are several alternative choices to improve upon such a deficiency, and each requires similar amounts of circuitry. Referring to FIGS. 6-8, the alternative implementations are illustrated. In a first alternative as illustrated in the circuit 600 of FIG. 6, the circuit can drive a constant logical zero back into the device using for example an inverter 604 and transistor 602 coupled to ground and the high impedance signal as illustrated. In a second alternative as shown in FIG. 7, a circuit 700 can drive a constant logical one back into the device using for example a transistor 702 coupled to VCC and the high impedance signal as shown. In a third alternative, a circuit can maintain the last value driven. For example, in FIG. 8, a circuit 800 similar to circuits 600 and 700 includes a "keeper" circuit (circulating inverters) 802 that are controlled by a programmable interconnection point (PIP) pass transistor 804, with a configuration cell. If a logic one is in that configuration cell, the keeper 802 will track the input buffer signal "IN" and automatically hold the last value when the input buffer floats. Alternatively, the circuit 800 can include two buffers 806 and 808, each asserted by HI-Z being low, and each distinctly enabled by its own PIP/configuration bit. One will drive the IN signal low, and the other will drive the signal high. Note a key assumption with these buffers. Two or more of these configuration cells should never be logic one, as contention will occur. Software manages the buffers to avoid such situations. However, if none of the configuration cells are logic one, then the input buffer behaves as a standard input, and can float and increase the power. The PIP pass transistors might also be transmission gates or another technology.

Figure 9:
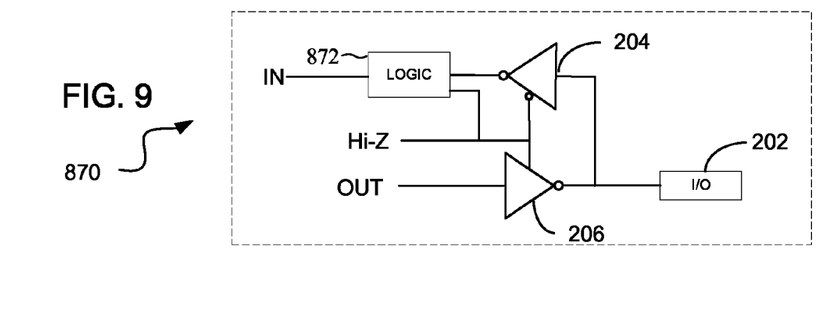
FIG. 9 is a block/schematic diagram depicting a fourth alternative for an input driver in a CMOS bidirectional circuit in accordance with an embodiment of the present invention.

In yet another alternative as illustrated in FIG. 9, a circuit 870 can make the condition selectable among the three choices described above on a pin by pin basis for a particular device. In the circuit 870, many choices can exist for a logic box 872, which can hold a simple keeper, or alternatively logic gates combining the received input value and the HI-Z variable to create appropriate binary signals to statically feed the device internals. Further note that the embodiments herein can include logic to handle both input crowbar current as well as reduce alternate current (a.c.) chatter of outputs switching back into the device.

Figure 10:
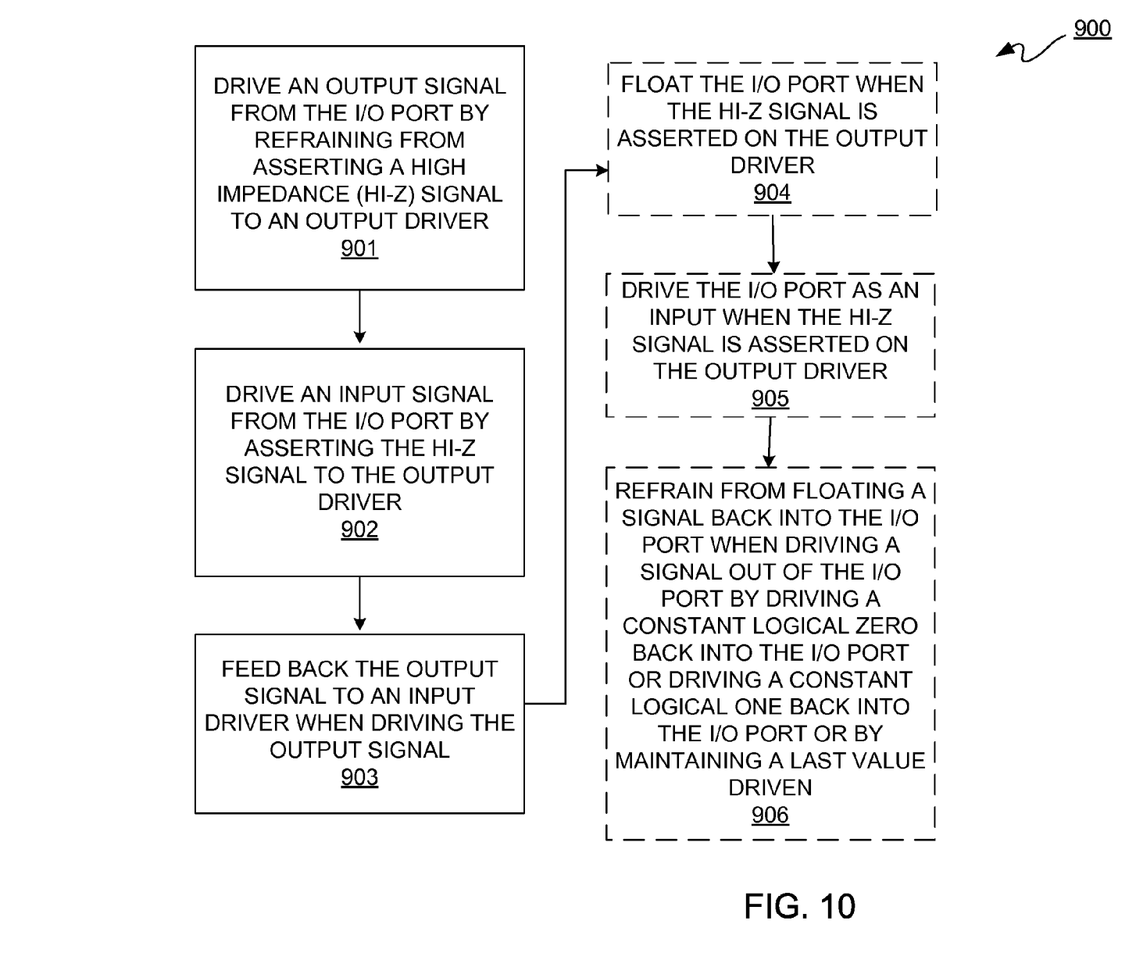
FIG. 10 is a flow chart illustrating a method of reducing power in digital bidirectional I/O ports in accordance with an embodiment of the present invention.

Referring to FIG. 10, a flow chart illustrates a method 900 of reducing power in digital bidirectional Input/Output (I/O) ports. The method 900 can include driving an input signal from the I/O port by asserting the Hi-Z signal to the output drive at step 901 and driving an output signal from the I/O port by refraining from asserting a high impedance (Hi-Z) signal to an output driver at step 902. At step 903, the method can feed back the output signal to an input driver when driving the output signal. At step 904, the method can float the I/O port when the Hi-Z signal is asserted on the output driver. At step 905, the method can drive the I/O port as an input when the Hi-Z signal is asserted on the output driver. Finally, the method can refrain from floating a signal back into the I/O port when driving a signal out of the I/O port by driving a constant logical zero back into the I/O port or driving a constant logical one back into the I/O port or by maintaining a last value driven at step 906.

While the foregoing describes exemplary embodiment(s) in accordance with one or more aspects of the invention, other and further embodiment(s) in accordance with the one or more aspects of the invention may be devised without departing from the scope thereof, which is determined by the claim (s) that follow and equivalents thereof. Claim(s) listing steps do not imply any order of the steps.

What is claimed is:

1. A method of reducing power in digital bidirectional Input/Output (I/O) ports, comprising:
   driving an output signal from the I/O port by refraining from asserting a high impedance (Hi-Z) signal to an output driver;
   driving an input signal from the I/O port by asserting the Hi-Z signal to the output driver; and
   maintaining a signal at an output of an input driver coupled to the I/O port at a fixed level when driving the output signal from the I/O port.

2. The method of claim 1, wherein the method further comprises feeding back the output signal to an input driver when driving the output signal.

3. The method of claim 1, wherein the method floats the I/O port when the Hi-Z signal is asserted on the output driver.

4. The method of claim 1, wherein the method drives the I/O port as an input when the Hi-Z signal is asserted on the output driver.

5. The method of claim 1, wherein the method floats the I/O port or drives the I/O port as an input when the Hi-Z signal is asserted on the output driver.

6. The method of claim 1, wherein the method refrains from floating a signal back into the I/O port when driving a signal out of the I/O port by driving a constant logical zero back into the I/O port.

7. The method of claim 1, wherein the method refrains from floating a signal back into the I/O port when driving a signal out of the I/O port by driving a constant logical one back into the I/O port.

8. The method of claim 1, wherein the method refrains from floating a signal back into the I/O port when driving a signal out of the I/O port by maintaining a last value driven.

9. A low power bi-directional Input/Output (I/O) arrangement, comprising:
   a bi-directional I/O port;
   an output driver coupled to the I/O port;
   an input driver coupled to the I/O port and coupled to the output of the output driver;

wherein an input signal is driven from the I/O port by asserting a high impedance (Hi-Z) signal on the output driver and an output signal is driven from the I/O port by refraining from asserting the Hi-Z signal to the output driver; and wherein a signal at an output of the input driver is maintained at a fixed level when driving the output signal from the I/O port.

10. The I/O arrangement of claim 9, wherein the output driver comprises a current blocking pair in the form of a series of P and N channel transistors.

11. The I/O arrangement of claim 9, wherein the I/O arrangement forms a portion of a CMOS device.

12. The I/O arrangement of claim 9, wherein the output signal is feed back to the input driver when driving the output signal.

13. The I/O arrangement of claim 9, wherein the I/O port floats when the Hi-Z signal is asserted on the output driver.

14. The I/O arrangement of claim 9, wherein the I/O port is driven as an input when the Hi-Z signal is asserted on the output driver.

15. The I/O arrangement of claim 9, wherein the I/O port floats or the I/O port is driven as an input when the Hi-Z signal is asserted on the output driver.

16. The I/O arrangement of claim 9, wherein the I/O arrangement refrains from floating a signal back into the I/O port when driving a signal out of the I/O port by driving a constant logical zero back into the I/O port.

17. The I/O arrangement of claim 9, wherein the I/O arrangement refrains from floating a signal back into the I/O port when driving a signal out of the I/O port by driving a constant logical one back into the I/O port.

18. The I/O arrangement of claim 9, wherein the I/O arrangement refrains from floating a signal back into the I/O port when driving a signal out of the I/O port by maintaining a last value driven.

19. The I/O arrangement of claim 9, wherein the I/O arrangement further comprises logic circuitry for selecting one among the functions of driving a constant logical zero back into the I/O port, driving a constant logical one back into the I/O port, or maintaining a last value driven.

20. A method of reducing power in digital bidirectional Input/Output (I/O) ports, comprising:

driving an output signal from the I/O port at a first time;

driving an input signal from the I/O port at a second time;

setting a configuration bit associated with an input driver coupled to the I/O port; and maintaining a signal at an output of the input driver at a fixed level based upon the configuration bit when driving the output signal from the I/O port.

* * * * *